(12) United States Patent
Kim et al.

(10) Patent No.: US 8,890,330 B2
(45) Date of Patent: Nov. 18, 2014

(54) SEMICONDUCTOR PACKAGES AND ELECTRONIC SYSTEMS INCLUDING THE SAME

(71) Applicant: Samsung Electronics Co., Ltd., Suwon-Si (KR)

(72) Inventors: Kyung-Man Kim, Hwaseong-Si (KR); In-Ku Kang, Suwon-si (KR); Ji-Hyun Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/690,678

(22) Filed: Nov. 30, 2012

(65) Prior Publication Data
US 2013/0087929 A1    Apr. 11, 2013

Related U.S. Application Data

(62) Division of application No. 12/656,086, filed on Jan. 15, 2010, now abandoned.

(30) Foreign Application Priority Data

Mar. 31, 2009    (KR) ........................ 10-2009-0027757

(51) Int. Cl.
*H01L 23/02*    (2006.01)
*H01L 23/48*    (2006.01)
(Continued)

(52) U.S. Cl.
CPC ................ *H01L 23/49* (2013.01); *H01L 25/18* (2013.01); *H01L 2224/49171* (2013.01);

(58) Field of Classification Search
CPC ................ H01L 2924/00; H01L 2924/00014; H01L 2224/48227; H01L 2224/73265; H01L 2224/3225; H01L 23/49; H01L 23/3128; H01L 24/48; H01L 24/49; H01L 24/00; H01L 25/0652; H01L 25/0657; H01L 25/18; H01L 2224/32145; H01L 2224/48091; H01L 2224/48137; H01L 2224/48145; H01L 2224/48235; H01L 2224/484; H01L 2224/4911; H01L 2224/4917; H01L 2224/49171; H01L 2224/83191; H01L 2224/32225; H01L 2924/01047; H01L 2924/01083; H01L 2924/014; H01L 2924/15311; H01L 2924/01033; H01L 2924/00012

USPC .......... 257/686, 692, 723, 777, 784, E27.001, 257/E27.011, E25.001, E25.01, E25.006, 257/E25.013, E25.024, E23.085, E23.169

See application file for complete search history.

(56) References Cited

U.S. PATENT DOCUMENTS 6,433,421 B2    8/2002    Masuda et al.
6,900,528 B2    5/2005    Mess et al.
(Continued)

*Primary Examiner* — Teresa M Arroyo
(74) *Attorney, Agent, or Firm* — Harness, Dickey & Pierce, P.L.C.

(57) ABSTRACT

Provided are semiconductor packages and electronic systems including the same. A first memory chip may be stacked on a first portion of a substrate. A controller chip may be stacked on a second portion of the substrate, which is different from the first portion. At least one first bonding wire may directly connect the first memory chip with the controller chip. At least one second bonding wire may directly connect the first memory chip with the substrate, and may be electrically connected with the at least one first bonding wire.

8 Claims, 5 Drawing Sheets

(51) Int. Cl.
*H01L 23/52* (2006.01)
*H01L 23/34* (2006.01)
*H01L 29/40* (2006.01)
*H01L 25/18* (2006.01)
*H01L 23/49* (2006.01)
*H01L 25/065* (2006.01)
*H01L 23/00* (2006.01)
*H01L 23/31* (2006.01)

(52) U.S. Cl.
CPC . *H01L 2224/484* (2013.01); *H01L 2924/01047* (2013.01); *H01L 2924/014* (2013.01); *H01L 2225/0651* (2013.01); *H01L 2224/32145* (2013.01); *H01L 2224/48235* (2013.01); *H01L 2224/48145* (2013.01); H01L 25/0657 (2013.01); H01L 24/00 (2013.01); *H01L 2224/73265* (2013.01); *H01L 2224/48227* (2013.01); *H01L 2924/15311* (2013.01); *H01L 2224/48137* (2013.01); *H01L 2224/83191* (2013.01); H01L 23/3128 (2013.01); *H01L 2924/01083* (2013.01); H01L 24/49 (2013.01); *H01L 2924/01033* (2013.01); *H01L 2224/4917* (2013.01); H01L 25/0652 (2013.01); *H01L 2224/4911* (2013.01); *H01L 2225/06506* (2013.01); *H01L 2224/32225* (2013.01); *H01L 2224/48091* (2013.01); H01L 24/48 (2013.01); *H01L 2225/06562* (2013.01)
USPC ........... 257/777; 257/686; 257/692; 257/723; 257/784; 257/E25.013

(56) References Cited

U.S. PATENT DOCUMENTS

| | | | |
|---|---|---|---|
| 7,443,011 B2 * | 10/2008 | Cusack et al. | 257/666 |
| 7,709,946 B2 | 5/2010 | Ryu et al. | |
| 2001/0011766 A1 | 8/2001 | Nishizawa et al. | |
| 2002/0052633 A1 | 5/2002 | Prutchi et al. | |
| 2006/0170084 A1 | 8/2006 | Masuda et al. | |
| 2006/0205280 A1 | 9/2006 | Nishizawa et al. | |
| 2006/0267173 A1 | 11/2006 | Takiar et al. | |
| 2007/0069374 A1 * | 3/2007 | Chen et al. | 257/723 |
| 2007/0111384 A1 | 5/2007 | Kinoshita et al. | |
| 2007/0187814 A1 * | 8/2007 | Cusack et al. | 257/723 |
| 2007/0218588 A1 * | 9/2007 | Takiar et al. | 438/109 |
| 2007/0222086 A1 * | 9/2007 | Briggs | 257/784 |
| 2007/0252263 A1 | 11/2007 | Jow | |
| 2008/0254571 A1 * | 10/2008 | Corisis et al. | 438/109 |
| 2009/0004781 A1 | 1/2009 | Liao et al. | |

* cited by examiner

SEMICONDUCTOR PACKAGES AND ELECTRONIC SYSTEMS INCLUDING THE SAME

CROSS-REFERENCE TO RELATED APPLICATIONS

This application is a divisional application of U.S. application Ser. No. 12/656,086, filed Jan. 15, 2010, which claims priority under 35 USC §119 to Korean Patent Application No. 10-2009-0027757, filed on Mar. 31, 2009, in the Korean Intellectual Property Office (KIPO), the entire contents of each of which are incorporated herein by reference.

BACKGROUND

1. Field

Example embodiments relate to semiconductor devices and electronic systems including the same, and more particularly, to semiconductor packages having a plurality of semiconductor chips mounted thereon and electronic systems including the same.

2. Description of the Related Art

Semiconductor products require processing of high-volume data in spite of a decrease in their volume. As a result, highly integrated semiconductor chips used in the semiconductor products and implemented in the semiconductor chips as a single package are necessary. However, higher integration of the semiconductor chips is difficult to achieve due to the limitation of integration technologies and is more expensive.

SUMMARY

According to example embodiments, there is provided a semiconductor package. A substrate is provided. A first memory chip may be stacked on a first portion of a substrate. A controller chip may be stacked on a second portion of the substrate, which is different from the first portion. At least one first bonding wire may directly connect the first memory chip with the controller chip. At least one second bonding wire may directly connect the first memory chip with the substrate, and may be electrically connected with the at least one first bonding wire.

In example embodiments, the first memory chip may include at least one first electrode pad, the controller chip may include at least one second electrode pad, and the at least one first bonding wire may directly connect the at least one first electrode pad with the at least one second electrode pad.

In example embodiments, the semiconductor package may further include a plurality of second memory chips stacked on the first memory chip, and the plurality of second memory chips may be electrically connected with the first memory chip. A plurality of third bonding wires may directly connect the plurality of second memory chips with the first memory chip.

In example embodiments, a third memory chip may be stacked on or below the first memory chip on the substrate, and at least one fourth bonding wire may directly connect the third memory chip with the substrate. In example embodiments, the controller chip may be a logic chip configured to control the first memory chip and has a plurality of redistribution lines thereon.

In example embodiments, there is provided a semiconductor package. A substrate including a plurality of bonding fingers is provided. A first memory chip may be stacked on a first portion of the substrate, and may include a plurality of first electrode pads. A controller chip may be stacked on a second portion of the substrate, which is different from the first portion, and may include a plurality of second electrode pads. A plurality of first bonding wires may directly connect the plurality of first electrode pads with the plurality of second electrode pads. A plurality of second bonding wires may directly connect the plurality of second electrode pads with the plurality of bonding fingers. A signal of the first memory chip may be transmitted to the substrate through the plurality of first bonding wires and the plurality of second bonding wires.

In example embodiments, the length of an electrical path from the plurality of first electrode pads to the substrate corresponds to the sum of the lengths of the first bonding wire and the second bonding wire. The controller chip may further include a plurality of redistribution pads and a plurality of redistribution lines configured to directly connect the plurality of second electrode pads with the plurality of redistribution pads, and the plurality of second bonding wires may directly connect the plurality of bonding fingers with the plurality of redistribution pads.

In example embodiments, the semiconductor package may further include a plurality of second memory chips stacked on the first memory chip, the plurality of second memory chips configured to electrically connect with the first memory chip, and a plurality of third bonding wires directly connecting the plurality of second memory chips with the first memory chip.

In example embodiments, two of the plurality of second memory chips may be adjacent to each other and may be stacked in offset directions from one another and one of the plurality of second memory chips, which is the lowermost, may be connected with the first memory chip. The semiconductor package may further include a third memory chip stacked on or below the first memory chip on the substrate, and at least one fourth bonding wire directly connecting the third memory chip with the substrate.

According to example embodiments, an electronic system may include an input/output unit communicating data with an external device, a memory unit storing the data and a processor unit executing the data, wherein the memory unit includes either of the semiconductor packages of example embodiments. The processor unit, the input/output unit, and the memory unit may communicate data therebetween via a bus.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1:
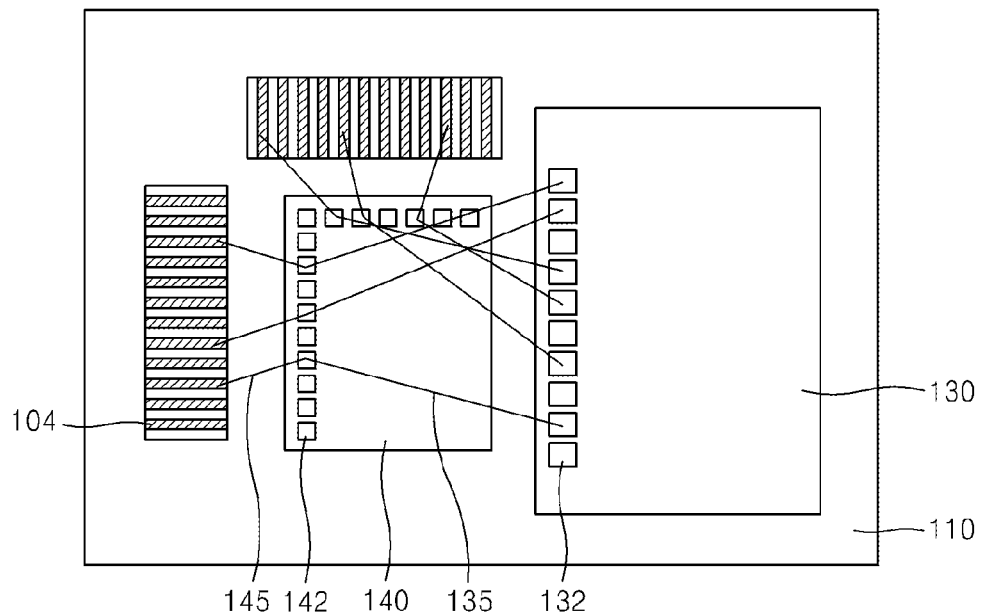
FIGS. 1, 3 and 9 are plane views illustrating semiconductor packages according to example embodiments.

Hereinafter, the inventive concept will be described in detail by describing example embodiments with reference to the accompanying drawings. However, the inventive concept is not limited by example embodiments to be disclosed below and may be implemented in various forms. Example embodiments are only provided to make the disclosure of the inventive concept complete and make those of ordinary skill in the art fully know the scope of the inventive concept. In the drawings, the sizes of elements may be exaggerated for convenience of illustration.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
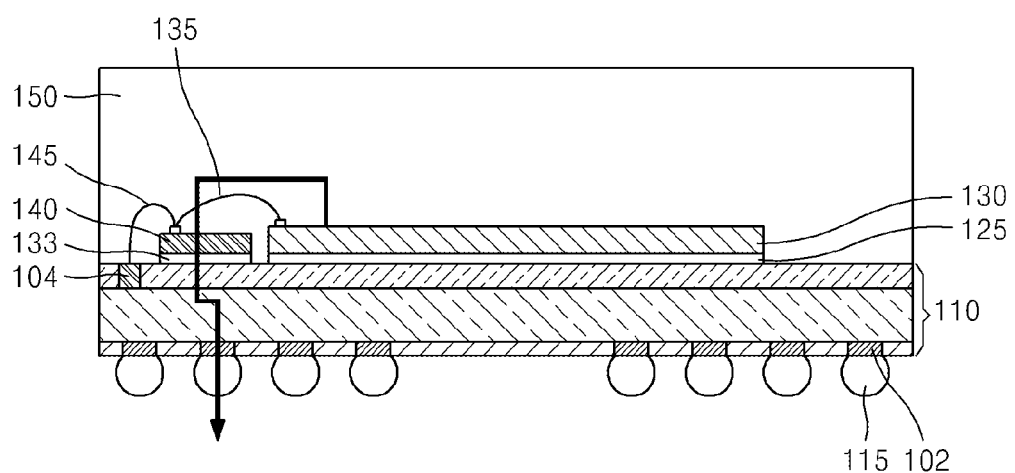
FIG. 2 is a cross-sectional view of the semiconductor package illustrated in FIG. 1.

FIG. 1 is a plane view illustrating a semiconductor package according to example embodiments. FIG. 2 is a cross-sectional view of the semiconductor package illustrated in FIG. 1. Referring to FIGS. 1 and 2, a substrate 110 is provided. For example, the substrate 110 may include various types of substrates, e.g., a printed circuit board (PCB), a flexible substrate and/or a tape substrate. The substrate 110 may include bonding fingers 104 on a top surface thereof and/or bump pads 102 on a bottom surface thereof.

Conductive bumps 115 may be attached on the bump pads 102. For example, the conductive bumps 115 may include solder balls. The numbers and arrangements of the bonding fingers 104, the bump pads 102, and the conductive bumps 115 are illustrated and may be properly selected according to the type and capacity of the semiconductor package.

A first memory chip 130 may be stacked on a first portion of the substrate 110. For example, the first memory chip 130 may be stacked on the first portion of the substrate 110 by interposing an adhesive member 125 between the first memory chip 130 and the first portion of the substrate 110. A controller chip 140 may be stacked on a second portion of the substrate 110, which is different from the first portion. For example, the controller chip 140 may be stacked on the second portion of the substrate 110 by interposing an adhesive member 133 between the controller chip 140 and the second portion of the substrate 110. The first memory chip 130 and the controller chip 140 may be disposed adjacent to each other on different regions of the substrate 110.

The first memory chip 130 may include first electrode pads 132 on a top surface thereof. The first electrode pads 132 may be connected with an internal circuit of the first memory chip 130 through a wiring structure. The controller chip 140 may include second electrode pads 142 on a top surface thereof. The second electrode pads 142 may be connected with an internal circuit of the controller chip 140 through a writing structure. The first electrode pads 132 and the second electrode pads 142 may be used as terminals for signal transmission of the first memory chip 130 and the controller chip 140. The numbers and arrangements of the first electrode pads 132 and the second electrode pads 142 are illustrated and may be properly selected according to the type and capacity of the semiconductor package.

At least one first bonding wire 135 may connect the first memory chip 130 with the controller chip 140. For example, the first bonding wire 135 may directly connect the first electrode pads 132 with the second electrode pads 142 by using a wire bonding method. At least one second bonding wire 145 may connect the controller chip 140 with the substrate 110. For example, the second bonding wire 145 may directly connect the second electrode pads 142 with the bonding fingers 104 by using a wire bonding method. The numbers and arrangements of the first bonding wire 135 and the second bonding wire 145 are illustrated and may be properly selected according to the type and capacity of the semiconductor package.

According to the above-described structure, a signal of the first memory chip 130 may be directly transmitted to the controller chip 140 through the first bonding wire 135 without passing through the substrate 110, thus reducing a signal transmission path in comparison to transmission of the signal of the first memory chip 130 to the controller chip 140 through the substrate 110. As a result, electrical resistance for signal transmission is reduced, thereby improving the performance of the semiconductor package.

A signal of the controller chip 140 may be transmitted to the substrate 110 through the second bonding wire 145. The substrate 110 may transmit and receive the signal transmitted from the controller chip 140 to and from an external product through the conductive bumps 115. A signal transmission path from the controller chip 140 to the substrate 110 is marked with an arrow in FIG. 2.

A molding member 150 may be formed on the substrate 110 such that the molding member 150 may cover the first memory chip 130, the controller chip 140, the first bonding wire 135, and the second bonding wire 145. For example, the molding member 150 may include an epoxy molding compound.

For example, the first memory chip 130 may be a memory chip and the controller chip 140 may be a logic chip for controlling the memory chip. The memory chip may include various types of memories, e.g., a dynamic random access memory (DRAM), a static random access memory (SRAM), a flash memory, a phase change random access memory (PRAM), a resistive random access memory (ReRAM), ferroelectric random access memory (FeRAM), or a magnetoresistive random access memory (MRAM). Such a semiconductor package may be used as an embedded memory card. In example embodiments, the controller chip 140 may be a controller for controlling the first memory chip 130. Because the embedded memory card, unlike an external memory card, does not require a slot, the embedded memory card may be used in small-size mobile devices. The embedded memory card also has flexibility in terms of product design, thus being a user-friendly solution. In example embodiments, both the first memory chip 130 and the controller chip 140 may be memory chips.

Figure 3:
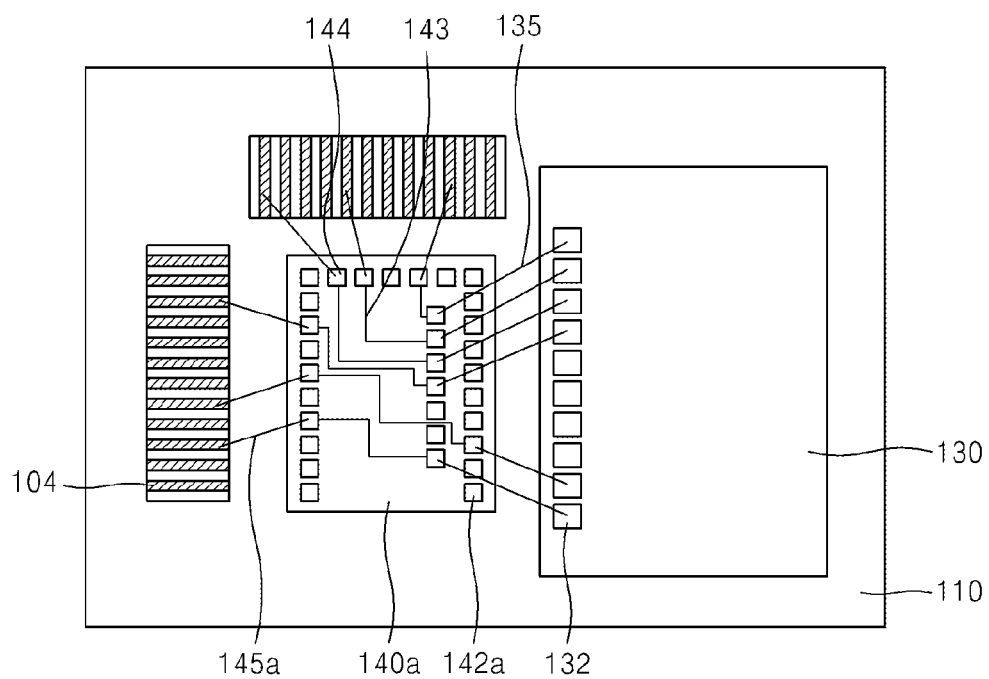

FIG. 3 is a plane view illustrating a semiconductor package according to example embodiments. The semiconductor package according to example embodiments as illustrated in FIG. 3 is a modification of the semiconductor package illustrated in FIG. 1, and thus a repetitive description thereof will be omitted.

Referring to FIG. 3, a controller chip 140a may include redistribution pads 144 in addition to second electrode pads 142a. Redistribution lines 143 may connect the second electrode pads 142a with the redistribution pads 144 to each other. The redistribution lines 143 may serve to move the positions of the second electrode pads 142a to the positions of the redistribution pads 144. Thus, the redistribution pads 144 may be disposed adjacent to the bonding fingers 104 placed on the substrate 110. At least one second bonding wire 145a may connect the redistribution pads 144 with the bonding fingers 104. By disposing the redistribution pads 144 adjacent to the bonding fingers 104, the arrangement of the second bonding wire 145a may be simplified.

Figure 4:
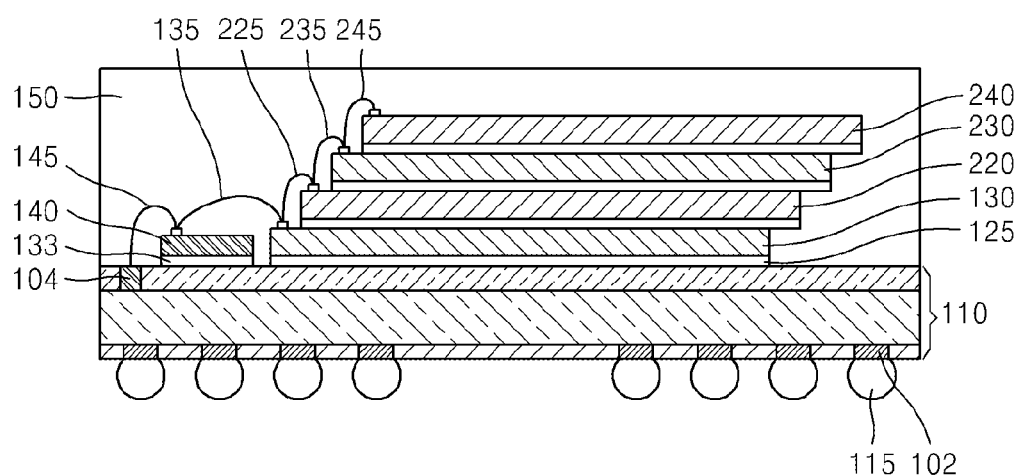
FIGS. 4-8 are cross-sectional views illustrating semiconductor packages according to example embodiments.

FIG. 4 is a cross-sectional view illustrating a semiconductor package according to example embodiments. The semiconductor package according to example embodiments as illustrated in FIG. 4 may refer to the description of the semiconductor packages illustrated in FIGS. 1 and 2, and thus a repetitive description thereof will be omitted.

Referring to FIG. 4, a plurality of second memory chips 220, 230, and 240 may be stacked on one another on the first memory chip 130. For example, the second memory chipsecond memory chips 220, 230, and 240 may be stacked on the first memory chip 130 such that they are stacked in offset directions from one another. The first memory chip 130 and the second memory chips 220, 230, and 240 may be connected with one another such that two of the second memory chips 220, 230 and 240, which are adjacent to each other, may be connected in offset directions from one another through third bonding wires 225, 235, and 245. For example, the third bonding wire 225 may connect the first memory chip 130 with the second memory chip 220. The third bonding wire 235 may connect the second memory chips 220 and 230, and the third bonding wire 245 may connect the second memory chips 230 and 240. For example, the first memory chip 130 and the second memory chips 220, 230, and 240 may be semiconductor chips of the same type.

According to this structure, signals of the first memory chip 130 and the second memory chips 220, 230, and 240 may be transmitted to the substrate 110 through the controller chip 140 or a signal of the substrate 110 may be transmitted to the first memory chip 130 and the second memory chips 220, 230, and 240 through the controller chip 140. In example embodiments, the controller chip 140 may be substituted by the controller chip 140a illustrated in FIG. 3.

Figure 5:
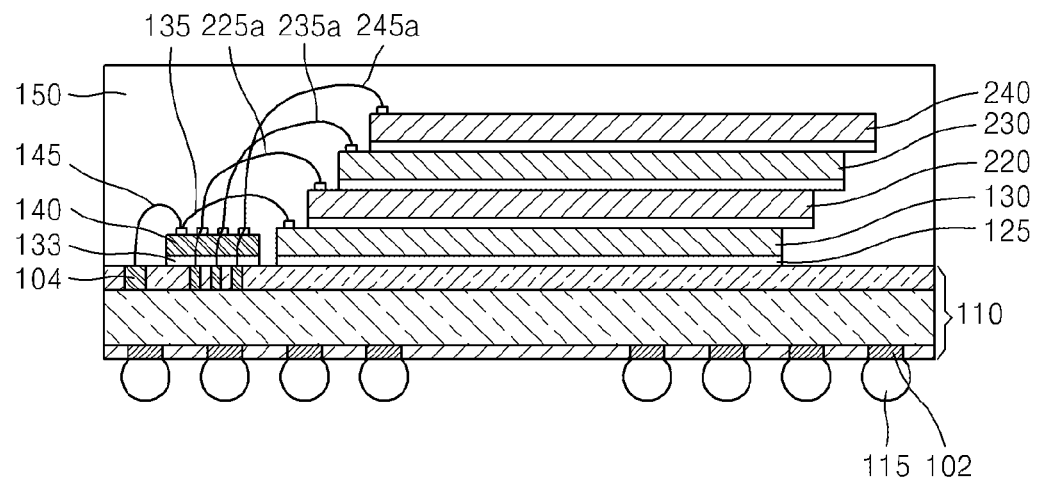

FIG. 5 is a cross-sectional view illustrating a semiconductor package according to example embodiments. The semiconductor package according to example embodiments as illustrated in FIG. 5 may refer to the description of the semiconductor packages illustrated in FIGS. 1 and 2, and thus a repetitive description thereof will be omitted.

Referring to FIG. 5, the plurality of second memory chips 220, 230, and 240 may be stacked on one another on the first memory chip 130. For example, the second memory chips 220, 230, and 240 may be stacked on the first memory chip 130 such that they are stacked in offset directions from one another. The first memory chip 130 may be connected with the controller chip 140 through the first bonding wire 135 and the second memory chips 220, 230, and 240 may be connected with the controller chip 130 through third bonding wires 225a, 235a, and 245a, respectively. For example, the first memory chip 130 and the second memory chips 220, 230, and 240 may be of the same or different type.

Thus, signals of the first memory chip 130 and the second memory chips 220, 230, and 240 may be transmitted to the substrate 110 through the controller chip 140 or a signal of the substrate 110 may be transmitted to the first memory chip 130 and the second memory chips 220, 230, and 240 through the controller chip 140. In example embodiments, the controller chip 140 may be substituted by the controller chip 140a illustrated in FIG. 3.

Figure 6:
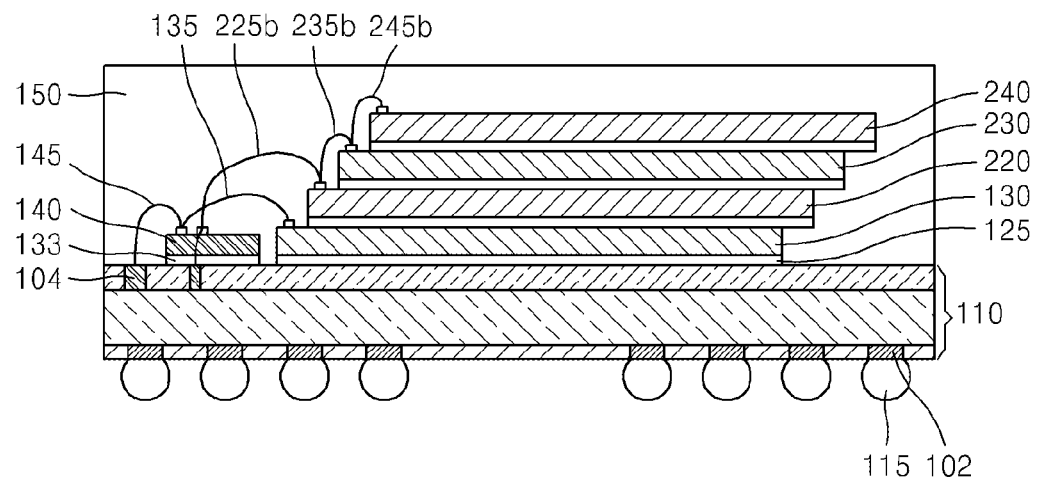

FIG. 6 is a cross-sectional view illustrating a semiconductor package according to example embodiments. The semiconductor package according to example embodiments as illustrated in FIG. 6 may refer to the description of the semiconductor packages illustrated in FIGS. 1 and 2, and thus a repetitive description thereof will be omitted.

Referring to FIG. 6, the plurality of second memory chips 220, 230, and 240 may be stacked on one another on the first memory chip 130. The first memory chip 130 may be connected with the controller chip 140 through the first bonding wire 135. The second memory chips 220, 230, and 240 may be connected with one another such that two of the second memory chips 220, 230 and 240, which are adjacent to each other, are connected in offset directions from one another through third bonding wires 235b and 245b, and the second memory chip 220 may be connected with the controller chip 130 through a third bonding wire 225b. For example, the second memory chips 220, 230, and 240 may be of the same type. The first memory chip 130 and the second memory chips 220, 230, and 240 may be of the same or different type.

Thus, signals of the first memory chips 130 and the second memory chips 220, 230, and 240 may be transmitted to the substrate 110 through the controller chip 140 or a signal of the substrate 110 may be transmitted to the first memory chips 130 and the second memory chips 220, 230, and 240 through the controller chip 140. In example embodiments, the controller chip 140 may be substituted by the controller chip 140a illustrated in FIG. 3.

Figure 7:
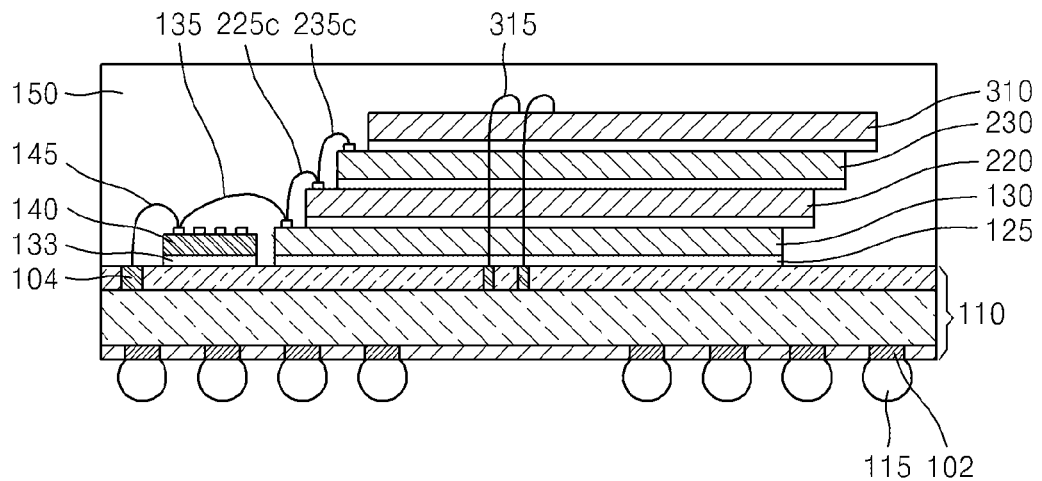

FIG. 7 is a cross-sectional view illustrating a semiconductor package according to example embodiments. The semiconductor package according to example embodiments as illustrated in FIG. 7 may refer to the description of the semiconductor packages illustrated in FIGS. 1 and 2, and thus a repetitive description thereof will be omitted.

Referring to FIG. 7, the plurality of second memory chips 220 and 230 may be stacked on the first memory chip 130 and a third memory chip 310 may be stacked on the second memory chip 230. For example, the first memory chip 130, the second memory chips 220 and 230, and the third memory chip 310 may have an offset stacking structure.

The first memory chip 130 may be connected with the controller chip 140 through the first bonding wire 135. The second memory chips 220 and 230 may be connected with each other through a third bonding wire 235c. The second memory chip 220 may be connected with the controller chip 140 through a second bonding wire 225c. The third memory chip 310 may be directly connected with the substrate 110 through a fourth bonding wire 315. For example, the first memory chip 130 and the second memory chips 220 and 230 may be of the same type. The second memory chips 220 and 230 and the third memory chip 310 may be of the same type or different type.

Thus, signals of the first memory chip 130 and the second memory chips 220 and 230 may be transmitted to the substrate 110 through the controller chip 140. On the other hand, a signal of the third memory chip 310 may be directly transmitted to the substrate 110 or may be transmitted to the controller chip 140 through the substrate 110. In example embodiments, the controller chip 140 may be substituted by the controller chip 140a illustrated in FIG. 3.

Figure 8:
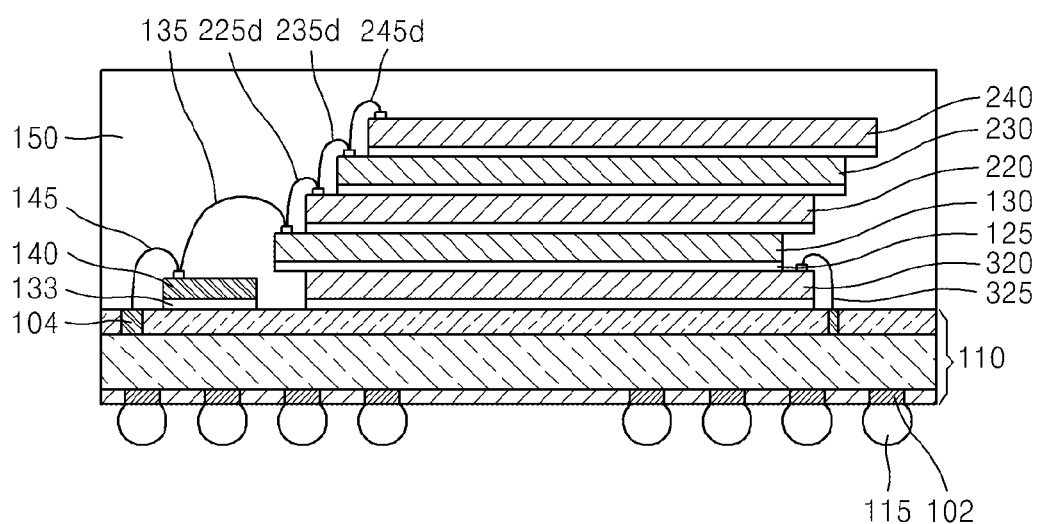

FIG. 8 is a cross-sectional view illustrating a semiconductor package according to example embodiments. The semiconductor package according to example embodiments as illustrated in FIG. 8 may refer to the description of the semiconductor packages illustrated in FIGS. 1 and 2, and thus a repetitive description thereof will be omitted.

Referring to FIG. 8, the plurality of second memory chips 220, 230, and 240 may be stacked on the first memory chip 130 and a third memory chip 320 may be stacked below the first memory chip 130 and on the substrate 110. For example, the first memory chip 130, the second memory chips 220, 230, and 240, and the third memory chip 310 may have a unidirectional or bidirectional offset stacking structure.

The first memory chip 130 may be connected with the controller chip 140 through the first bonding wire 135. The first memory chip 130 and the second memory chips 220, 230, and 240 may be stacked in offset directions from one another and connected through third bonding wires 225d, 235d, and 245d. The third memory chip 320 may be directly connected with the substrate 110 through a fourth bonding wire 325. For example, the first memory chip 130 and the second memory chips 220, 230, and 240 may be of the same type. The second memory chips 220, 230, and 240 and the third memory chip 320 may be of the same type or different type.

Signals of the first memory chip 130 and the second memory chips 220, 230, and 240 may be transmitted to the substrate 110 through the controller chip 140. On the other hand, a signal of the third memory chip 320 may be directly transmitted to the substrate 110 or may be transmitted to the controller chip 140 through the substrate 110. In example embodiments, the controller chip 140 may be substituted by the controller chip 140a illustrated in FIG. 3.

Figure 9:
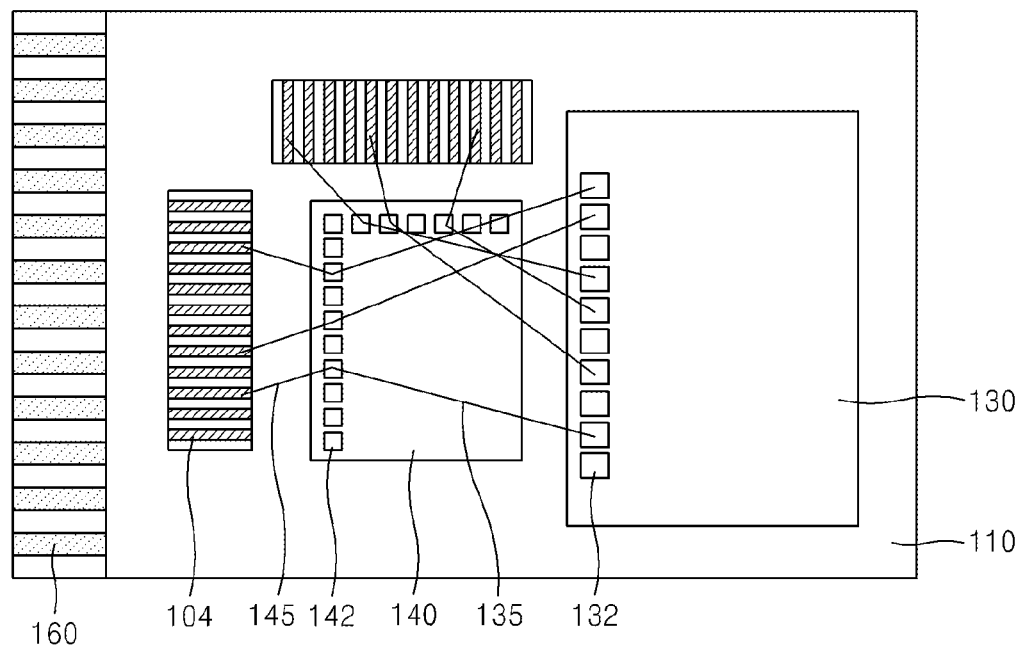

FIG. 9 is a plane view illustrating a semiconductor package according to example embodiments. The semiconductor package according to example embodiments as illustrated in FIG. 9 may refer to the description of the semiconductor packages illustrated in FIGS. 1 and 2, and thus a repetitive description thereof will be omitted.

Referring to FIG. 9, the substrate 110 may include conductive pins 160 instead of the conductive bumps 115 illustrated in FIG. 2. The conductive pins 160 may be at an edge of the substrate 110. The semiconductor package according to example embodiments may be inserted into a slot in the form of a card and thus may be used as an external memory card.

Figure 10:
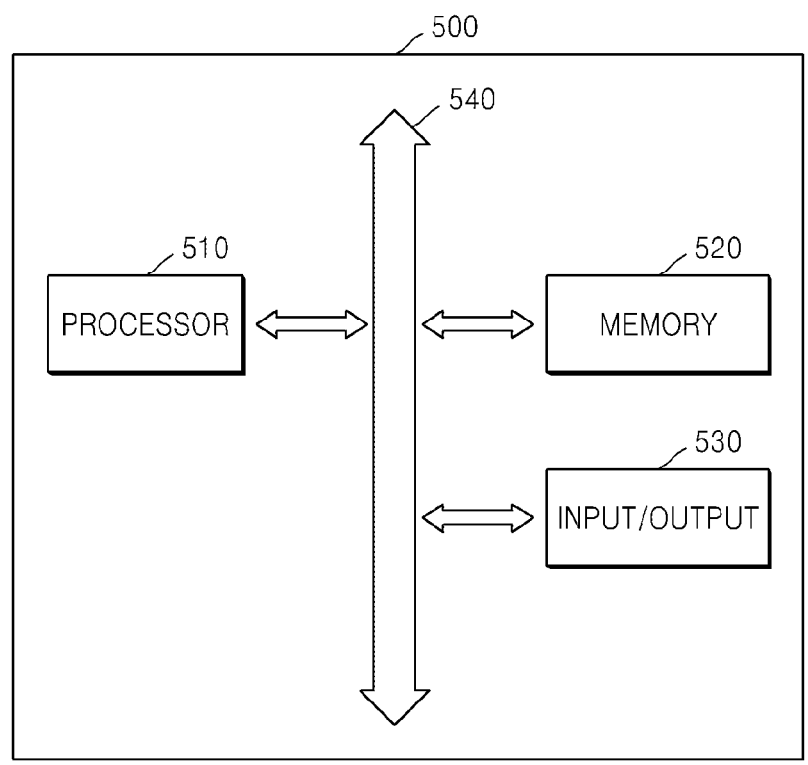
FIG. 10 is a block diagram illustrating an electronic system according to example embodiments.

FIG. 10 is a block diagram illustrating an electronic system according to example embodiments. Referring to FIG. 10, an electronic system 500 may include a processor unit 510, an input/output unit 530, and a memory unit 520, and the processor unit 510, the input/output unit 530, and the memory unit 520 may communicate data therebetween by using a bus 540. The processor unit 510 may serve to execute a program and control the electronic system 500. The input/output unit 530 may be used to input and output data to and from the electronic system 500. By using the input/output unit 530, the electronic system 500 may be connected to an external device, e.g., a personal computer or a network, and communicate data with the external device. The memory unit 520 may store codes and data for operations of the processor unit 510. For example, the memory unit 520 may include at least one of the semiconductor packages illustrated in FIGS. 1 through 9.

For example, the electronic system 500 may constitute various electronic control devices which require the memory unit 520, and may be used for mobile phones, MP3 players, navigations, solid state disks (SSDs), or household appliances.

The foregoing description of example embodiments has been provided for the purposes of illustration and description. Accordingly, the inventive concept is not limited to example embodiments and it will be obvious that various modifications and variations, such as implementation of combinations of example embodiments, may be made by those of ordinary skill in the art.

What is claimed is:

1. A semiconductor package comprising:
   a substrate;
   a first memory chip stacked on a first portion of the substrate;
   a controller chip stacked on a second portion of the substrate, the second portion being different from the first portion;
   at least one first bonding wire directly connecting the first memory chip with the controller chip; and
   at least one second bonding wire connecting the first memory chip with the substrate, the at least one second bonding wire being electrically connected with the at least one first bonding wire,
   wherein the first memory chip includes at least one first electrode pad, the controller chip includes at least one second electrode pad, and the at least one first bonding wire directly connects the at least one first electrode pad with the at least one second electrode pad, and
   wherein the controller chip further comprises at least one redistribution pad and at least one redistribution line configured to directly connect the at least one second electrode pad with the at least one redistribution pad, and
   wherein the substrate includes at least one bonding finger and the at least one second bonding wire directly connects the at least one bonding finger with the at least one redistribution pad.

2. The semiconductor package of claim 1, further comprising:
   a plurality of second memory chips stacked on the first memory chip, the plurality of second memory chips configured to electrically connect with the first memory chip.

3. The semiconductor package of claim 2, further comprising:
   a plurality of third bonding wires directly connecting the plurality of second memory chips with the first memory chip.

4. The semiconductor package of claim 2, wherein two of the plurality of second memory chips are adjacent to each other and are stacked in offset directions from one another and one of the plurality of second memory chips, which is located lowermost, is connected with the first memory chip.

5. The semiconductor package of claim 2, further comprising:
   a third memory chip stacked on or below the first memory chip on the substrate; and
   at least one fourth bonding wire connecting the third memory chip with the substrate.

6. The semiconductor package of claim 1, wherein the first memory chip is a memory chip and the controller chip is a logic chip configured to control the memory chip and has a plurality of redistribution lines thereon.

7. An electronic system comprising:
   an input/output unit communicating data with an external device;
   a memory unit storing the data; and
   a processor unit executing the data,
   wherein the memory unit includes a semiconductor package including,
      a substrate,
      a first memory chip stacked on a first portion of the substrate,
      a controller chip stacked on a second portion of the substrate, the second portion being different from the first portion,
      at least one first bonding wire directly connecting the first memory chip with the controller chip, and
      at least one second bonding wire connecting the first memory chip with the substrate, the at least one second bonding wire being electrically connected with the at least one first bonding wire,
   wherein the first memory chip includes at least one first electrode pad, the controller chip includes at least one second electrode pad, and the at least one first bonding wire directly connects the at least one first electrode pad with the at least one second electrode pact and
   wherein the controller chip further comprises at least one redistribution pad and at least one redistribution line configured to directly connect the at least one second electrode pad with the at least one redistribution pad, and
   wherein the substrate includes at least one bonding finger and the at least one second bonding wire directly connects the at least one bonding finger with the at least one redistribution pad.

8. The electronic system of claim 7, wherein the processor unit, the input/output unit, and the memory unit communicate data there between by using a bus.

\* \* \* \* \*